(12) United States Patent
Hagström

(10) Patent No.: US 6,961,544 B1
(45) Date of Patent: Nov. 1, 2005

(54) STRUCTURE OF A RADIO-FREQUENCY FRONT END

(75) Inventor: Panu Hagström, Oulu (FI)

(73) Assignee: Filtronic LK Oy, Kempele (FI)

(*) Notice: Subject to any disclaimer, the term of this patent is extended or adjusted under 35 U.S.C. 154(b) by 478 days.

(21) Appl. No.: 10/030,555

(22) PCT Filed: Jul. 13, 2000

(86) PCT No.: PCT/FI00/00644
§ 371 (c)(1),
(2), (4) Date: Jan. 4, 2002

(87) PCT Pub. No.: WO01/05048
PCT Pub. Date: Jan. 18, 2001

(30) Foreign Application Priority Data
Jul. 14, 1999 (FI) .................................. 991604

(51) Int. Cl.⁷ ................................................. H04B 1/46
(52) U.S. Cl. .......................... 455/82; 455/83; 455/86; 455/78; 455/79; 455/575.5; 455/575.7; 343/702; 343/752; 343/745
(58) Field of Search .................... 455/129, 550.1, 455/73, 82, 300, 86, 90.3, 83, 575.5, 575.7, 455/79, 78; 343/703, 702, 752, 745

(56) References Cited

U.S. PATENT DOCUMENTS

| | | | | |
|---|---|---|---|---|
| 4,143,369 A * | 3/1979 | Ayers | .......................... | 342/45 |
| 4,521,913 A * | 6/1985 | Huber et al. | ................ | 455/121 |
| 4,792,939 A | 12/1988 | Hikita et al. | ................... | 370/24 |
| 5,023,621 A * | 6/1991 | Ushiyama et al. | .......... | 343/702 |
| 5,231,407 A * | 7/1993 | McGirr et al. | ....... | 343/700 MS |
| 5,355,524 A * | 10/1994 | Higgins, Jr. | ................. | 455/82 |
| 5,404,581 A | 4/1995 | Honjo | ......................... | 455/90 |
| 5,432,489 A | 7/1995 | Yrjölä | ......................... | 333/202 |
| 5,585,810 A * | 12/1996 | Tsuru et al. | ................ | 343/745 |
| 5,659,886 A * | 8/1997 | Taira et al. | ................... | 455/81 |
| 5,903,820 A | 5/1999 | Hagström | .................... | 455/82 |

(Continued)

FOREIGN PATENT DOCUMENTS

DE  198 13 767  10/1998  ........... H04B 1/38

(Continued)

OTHER PUBLICATIONS

Sumitomo Electric IND LTD, Antenna, Sep. 19, 1988, Japan 63-222504.*

Primary Examiner—Lester G. Kincaid
Assistant Examiner—Khai Nguyen
(74) Attorney, Agent, or Firm—Darby & Darby

(57) ABSTRACT

The invention relates to an integrated structure of a radio-frequency front end of a communications apparatus. The antenna of the communications apparatus is constructed on a printed circuit board. To this antenna board (310), on its ground plane side, a second circuit board (321) is attached by means of a rigid protective frame (410), which second circuit board includes the other parts of the radio-frequency front end. Between the parts impedance levels are used that are appropriate from the electrical operation perspective. All said parts together form an integrated component (400) to be located inside the housing of the communications apparatus. The advantage of the invention is that it requires a smaller number of components needed for matching between the RF parts, and makes possible a greater sensitivity of the receiver as well as a better transmitter efficiency than prior art structures.

7 Claims, 3 Drawing Sheets

U.S. PATENT DOCUMENTS

Figure 1A:
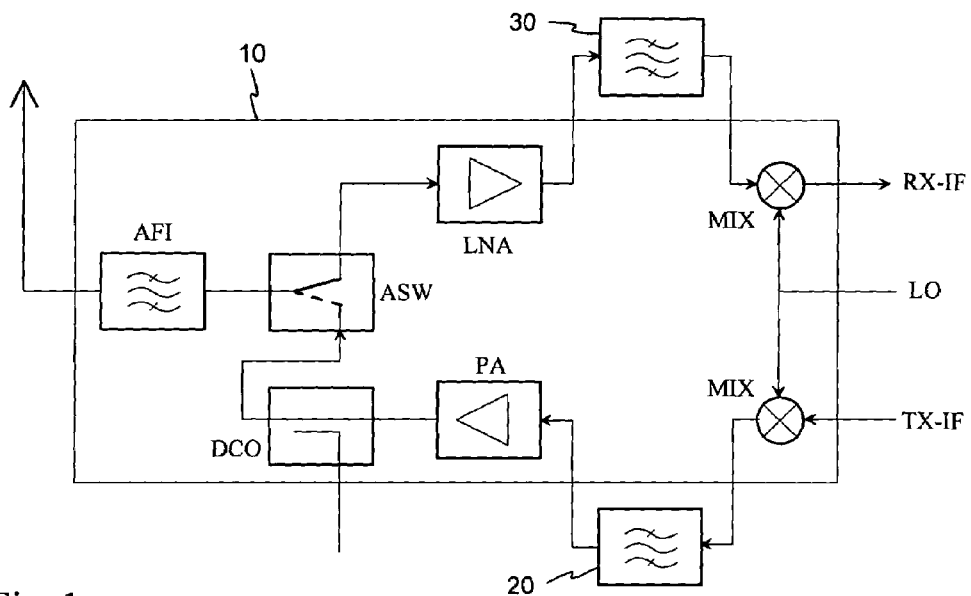

| | | | | |
|---|---|---|---|---|
| 5,969,681 A | * | 10/1999 | O'Neill, Jr. | 343/700 MS |
| 6,243,592 B1 | * | 6/2001 | Nakada et al. | 455/575.7 |
| 6,288,680 B1 | * | 9/2001 | Tsuru et al. | 343/702 |
| 6,341,217 B1 | * | 1/2002 | Wong | 455/575.5 |
| 6,567,647 B1 | * | 5/2003 | Epperson | 455/83 |

FOREIGN PATENT DOCUMENTS

| | | | |
|---|---|---|---|
| EP | 0 766 410 | 4/1997 | H03D 1/38 |
| WO | WO 93/14573 | 7/1993 | H04B 1/44 |

* cited by examiner

STRUCTURE OF A RADIO-FREQUENCY FRONT END

FIELD OF THE INVENTION

The invention relates to an integrated structure of a radio-frequency front end in a communications apparatus. The front end comprises at least an antenna as well as a radio-frequency amplifier and filter both in the transmit and receive branch.

BACKGROUND OF THE INVENTION

Several filters are needed in the radio-frequency part of a bi-directional radio apparatus such as a mobile station. Extra frequency components produced by a mixer as well as extra frequency components produced by a power amplifier have to be removed in the transmit branch. In the receive branch, filters are needed in order to achieve basic selectivity, protect a low-noise pre-amplifier, and to attenuate noise generated by the transmitter on the receive band. In the case of different transmit and receive frequencies a duplex filter is generally used to mutually separate the different directions of transmission. An antenna switch is used in systems in which the transmit and receive frequencies are the same, and in systems where transmission and reception take place both at different frequencies and at different moments of time. Other functional units in a radio-frequency front end include the aforementioned amplifiers, a directional coupler for measuring the transmission power for power control, and mixers.

Integration of successive radio-frequency units is difficult mainly because of the relatively large size of the filters. If, for example, an antenna switch, a low-noise amplifier (LNA) and a filter between them are integrated on one chip, the large size of the filter calls for relatively large connection strips that produce electrical stray quantities and inductive couplings which degrade the selectivity of the filter. Complete integration of a filter between active RF units with other units is therefore impractical.

Another thing that makes integration difficult is the fact that commercial components usually have input and output impedances of 50 Ω in order to make modular design easier. However, advantageous values for RF circuit input and output impedances are often different: for example, the optimum input impedance level of a LNA is about 100 to 200 Ω. If the amplifier has this input impedance, the matching to the standard impedance of the preceding circuit requires a separate matching circuit. This will increase both the size and cost of the radio apparatus. Moreover, the matching circuit causes additional losses on the signal on the transmission path, which, in turn, means a shorter talk time, among other things.

From the prior art it is known numerous structures aimed at achieving as high degree of integration of RF circuits as possible. Radios according to the prior art usually comprise at least one integrated component and discrete filters connected to it/them.

Patent document WO 93/14573 discloses a solution applicable to time division multiple access wherein all active components of the transceiver are integrated into a single circuit. A disadvantage of this solution is that there are matching problems between the integrated circuit and the filters external to it. In addition, the integrated circuit does not contain a directional coupler. An external directional coupler built into a printed circuit board is susceptible to electric disturbances, requires a considerable amount of space on the printed circuit board and, in addition, causes an extra loss of at least 0.5 dB in the transmitter chain, which has a direct impact on the current consumption of the communications apparatus.

From U.S. Pat. No. 4,792,939 a solution is known in which a duplexer, transmitter and receiver are integrated on one chip. In that solution the duplexer, a bandpass filter and a mixer are implemented using surface acoustic wave (SAW) technology. A drawback of the arrangement is that the matching circuits required by the SAW circuits are so large and the SAW circuits themselves are so lossy and have such a poor power capacity compared to the transmission power that application of the solution in a modern mobile phone is impossible.

U.S. Pat. No. 5,432,489 discloses a solution that uses transmission lines belonging to circuits of the transmitter branch bandpass filter or to matching circuit, as part of a directional coupler. This way, the directional coupler can be moved from the printed circuit board onto a low-loss substrate and inside the protective housing of the high-frequency filter. The advantage of the solution is that it saves space and reduces susceptibility to interference as well as the transmission loss caused by the directional coupler, but the disadvantage is that in other respects the integration problems remain.

Figure 1B:
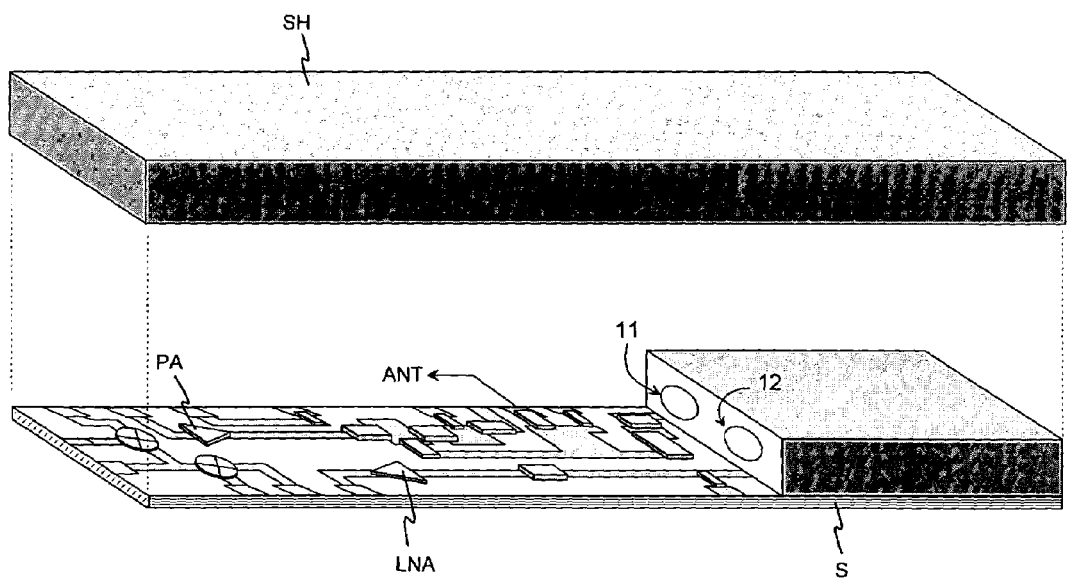

From U.S. Pat. No. 5,903,820 it is known a solution in which an antenna filter AFI, antenna switch ASW, directional coupler DCO, low-noise amplifier LNA, mixers MIX, and a power amplifier PA are integrated into one entity. This entity forms one component on the printed circuit board of a mobile station. FIG. 1a shows a block diagram of said entity 10, which is to be integrated. FIG. 1b shows an example of the practical implementation of the circuit 10. In the example, all parts are assembled onto one and the same low-loss substrate S. The most space-consuming parts are the coaxial resonators 11 and 12 that form the most significant part of the antenna filter AFI. The parts are located inside a common housing SH that protects them from interference.

An advantage of the structure according to FIG. 1 is that the number of structural elements needed for matching at the input of amplifier LNA and output of amplifier PA is smaller as there is no need to provide matching to the 50 Ω impedance level. Additional advantages include a reduction of parasitic effects, reduction of the number of components inserted onto the printed circuit board of the communications apparatus and reduction of the area needed on the circuit board. A drawback of the structure is that the transmit branch bandpass filter 20 and receive branch bandpass filter 30, shown in FIG. 1a, are still separate units on the circuit board. The antenna, too, is a discrete component.

An object of the invention is to reduce the above-described disadvantages of the prior art. The structure according to the invention is characterized by what is expressed in the independent claim. Preferred embodiments of the invention are disclosed in the other claims.

SUMMARY OF THE INVENTION

The basic idea of the invention is as follows: The antenna of the communications apparatus is constructed on a printed circuit board. To the antenna board, on its ground plane side, a second printed circuit board is attached by means of a rigid protective frame, which second circuit board includes the other parts of the radio-frequency front end. Between the parts impedance levels are used that are appropriate from the electrical operation perspective. All said parts together form a solid component to be located inside the housing of the communications apparatus.

An advantage of the invention is that the number of structural elements needed for matching between the RF parts is smaller than in prior-art structures. Another advantage of the invention is that it makes possible a greater sensitivity of receiver than prior art structures. The noise figure and the sensitivity of the receiver branch can be improved by means of internal optimization, for example. A further advantage of the invention is that it makes possible lower losses in the transmitter than prior art structures. For example, changing the input impedance of the power amplifier PA from 50 Ω to 2 Ω makes the design of the power amplifier considerably easier, at the same improving the efficiency of the power amplifier. Still another advantage of the invention is that it provides a single component that comprises the whole radio-frequency front end including the antenna. This leads to smaller communications apparatus and simplification of design.

The invention will now be described in detail. Reference will be made to the accompanying drawing wherein

BRIEF DESCRIPTION OF THE DRAWING FIGURES

Figure 2:
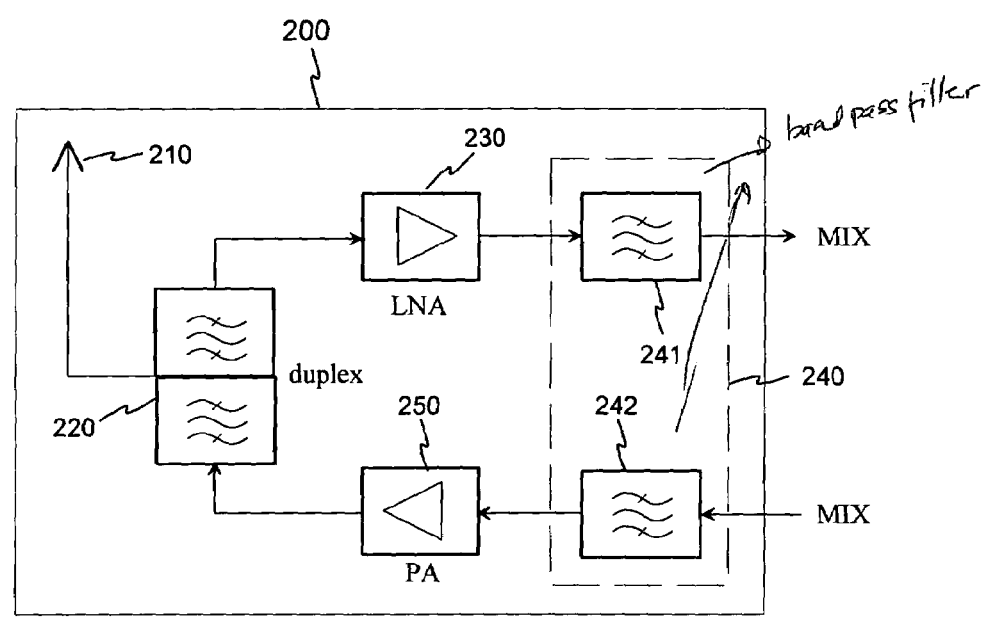
Figure 3A:
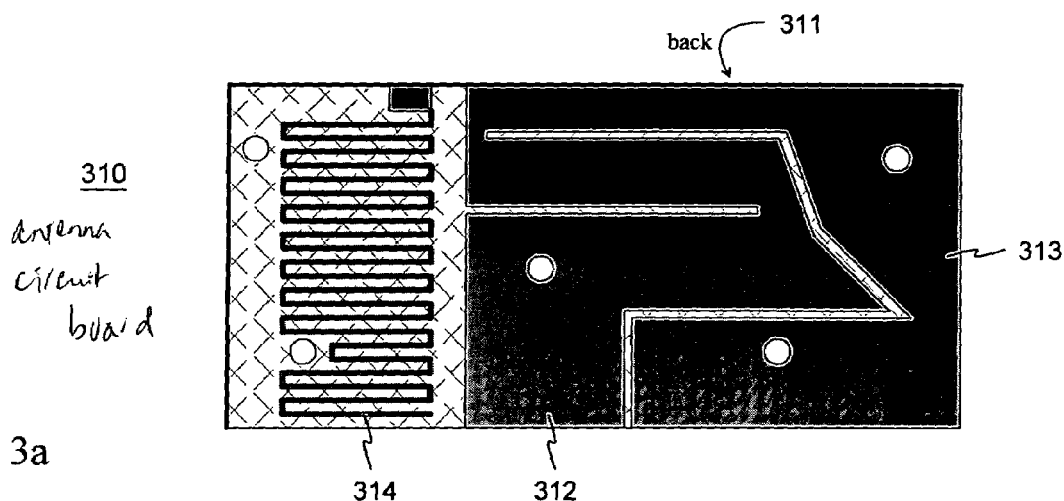
Figure 3B:
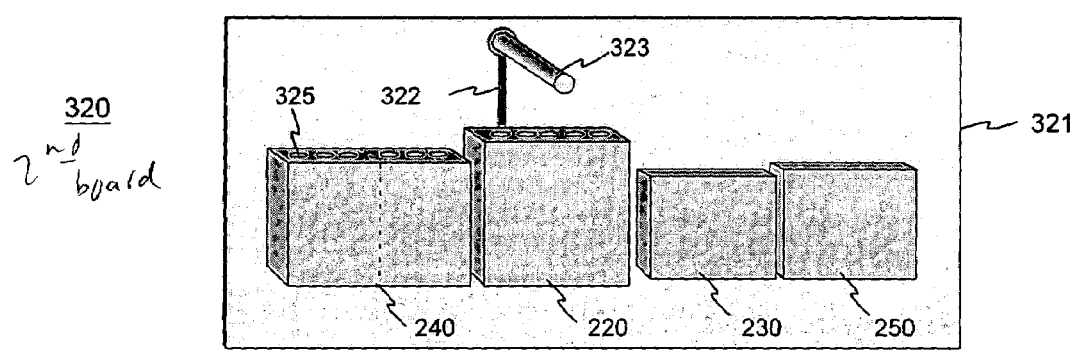
Figure 4:
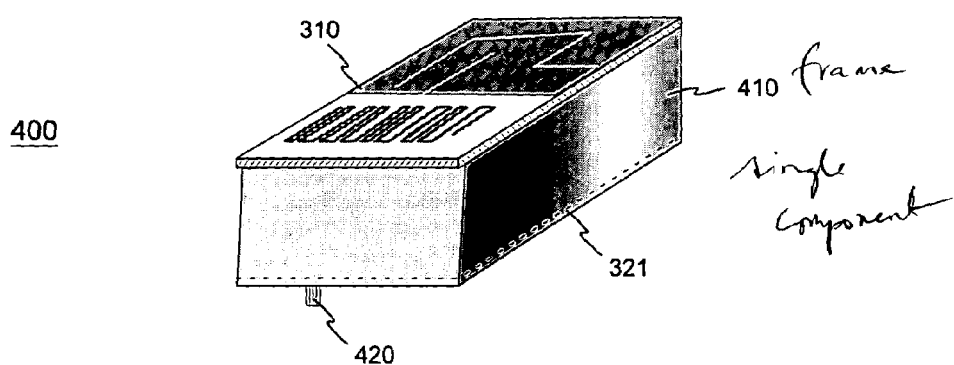

FIG. 1a shows in the form of block diagram an example of the front end of a communications apparatus, FIG. 1b shows an example of the practical implementation of the prior-art front end according to FIG. 1a, FIG. 2 shows in the form of block diagram a second example of the front end of a communications apparatus, FIG. 3a shows an example of an antenna board according to the invention, FIG. 3b shows an example of a placement according to the invention of functional modules, and FIG. 4 shows in the form of component an example of a front end according to the invention.

DETAILED DESCRIPTION OF ILLUSTRATIVE EMBODIMENTS

FIGS. 1a and 1b were already discussed in connection with the description of the prior art.

FIG. 2 shows a block diagram of a possible radio-frequency front end of a communications apparatus. The front end 200 comprises an antenna 210, duplex filter 220, low-noise amplifier 230, bandpass filters 241 and 242, and a power amplifier 250. The antenna is connected to a bi-directional antenna port in the duplex filter 220. The receive port of the duplex filter is connected to the input of the amplifier 230, and the output of the amplifier 230 is connected to the input of the bandpass filter 241. The output of the filter 241 is connected to the receive branch mixer, and the input of the filter 242 is connected to the transmit branch mixer. The output of the filter 242 is connected to the input of the amplifier 250, and the output of the amplifier 250 is connected to the transmit port of the duplex filter 220.

Next it will be described how a front end 200 according to FIG. 2 is integrated into a single component in accordance with the invention.

FIG. 3a shows an example of an antenna structure according to the invention. What is essential is that the antenna as a component is board-like. FIG. 3a shows an antenna circuit board 310 which has on its lower surface, or second surface, which is not visible in FIG. 3a, a ground plane 311 which covers substantially the whole area of the surface. On the upper surface, or first surface, of the circuit board 310 there are in this example three radiating elements: conductive areas 312, 313 and 314. Conductive areas 312 and 313 are planar, and if, in addition to having a common feed, they are shorted to ground, they form a dual-frequency planar inverted-F antenna (PIFA). Conductive patch 314 comprises a meander-patterned conductor. It can be made to radiate at either of the PIFA frequency ranges or at some third frequency range. The board 310 is drawn in FIG. 3a considerably larger than its real size.

FIG. 3b illustrates a way of assembling the other functional units of the RF front end. Shown in FIG. 3b is a board-like piece 321 which may be a printed circuit board. Four modules 220, 230, 240 and 250 are placed on the board 321. The reference numerals correspond to those of FIG. 2. Module 220 comprises a duplex filter, module 230 a low-noise amplifier LNA, module 240 bandpass filters 241 and 242, and module 250 comprises a power amplifier PA. In this example the filters are realized using coaxial resonators. In the figure is pointed to one resonator 325. FIG. 3b shows a pin-like conductor 323 the function of which is to provide a connection between the board 321 and antenna board 310. The conductor 323 is by its lower end connected to the filter 220 through a conductive strip 322. The other connections on the board 321 are not shown. The lower surface of the board 321, which is not visible in FIG. 3b, is conductive. The board 321 and the modules on it are drawn considerably larger than they are in real life.

FIG. 4 shows an example of a front end assembled into a single component. The component 400 comprises an antenna circuit board 310, module assembly 320 and a rigid mechanical frame 410. The frame 410 supports both the antenna board and board 321. Thereby is produced a protective housing for the filters and amplifiers. FIG. 4 shows a conductor 420 extending downward, which is one conductor between the component 400 and the rest of the communications apparatus. The parts shown in FIG. 4 are mechanically strong and firmly attached to each other so that the component 400 formed is compact. In real life it is smaller than in the drawing.

Above it was described a solution according to the invention. The invention does not limit the number or size of the elements in the antenna board. Neither does the invention limit the number or nature or internal realization of the RF units in the front end. The present invention is not limited to any particular application, too. It can be used in transceivers in various applications and at different frequencies and with different multiple access methods, advantageously at radio frequencies such as UHF and VHF. The arrangement according to the invention can be used in subscriber apparatus of a system based on digital time division multiple access (TDMA/FDMA, TDMA/FDD, or TDMA/TDD) that have a separate or integrated antenna, in car phones and in hand phones. The inventional idea can be applied in many ways within the scope defined by the independent claims.

I claim:

1. A structure of a radio frequency front end comprising as functional units an antenna and at least one bandpass filter and at least one amplifier, in which front end active and passive component parts have been integrated, the structure further comprising:

an antenna circuit board having a first surface on which there is at least one radiating element and on a second surface of which there is a conductive plane;

a second circuit board having a first surface on which said at least one filter and at least one amplifier are supported, and a second surface of which is conductive; and a protective frame such that the antenna circuit board second surface, the second circuit board first surface and the protective frame form a substantially closed space;

wherein the antenna circuit board, the second circuit board with attached units and the protective frame form a single solid component, and the distance between the second circuit board and the antenna circuit board in said component is substantially smaller than a quarter of a wavelength corresponding to any operation frequency of said front end.

2. The structure of claim 1, comprising both a transmit and a receive branch, said functional units being a duplex filter, a low-noise amplifier and a receive filter, a transmit filter and a power amplifier, and a directional coupler.

3. The structure of claim 1, comprising both a transmit and a receive branch, said functional units being an antenna filter and antenna switch, a low-noise amplifier and a receive filter, a transmit filter and a power amplifier, and a directional coupler.

4. The structure of claim 2, said functional units further being at least a transmit branch mixer, a receive branch mixer, a modulator, a demodulator and filters associated with these.

5. The structure of claim 1, said antenna being a multi-frequency antenna having at least two radiating elements on the antenna circuit board.

6. A communications apparatus having a radio-frequency front end, which comprises:

an antenna circuit board having a first surface on which there are formed radiating elements of an antenna of the communications apparatus and on a second surface of which there is a conductive plane;

a second circuit board by which functional units of said front end are supported on a first surface, and a second surface of which is conductive; and a protective frame such that the antenna circuit board second surface, the second circuit board first surface and the protective frame form a substantially closed space;

wherein the antenna circuit board, the second circuit board with attached units and the protective frame form a single solid component, and the distance between the second circuit board and the antenna circuit board in said component is substantially smaller than a quarter of a wavelength corresponding to any operation frequency of said front end, and said component is completely inside covers of the communications apparatus.

7. The structure of claim 3, said functional units further being at least a transmit branch mixer, a receive branch mixer, a modulator, a demodulator and filters associated with these.

* * * * *